(12) United States Patent
Sato

(10) Patent No.: US 11,430,503 B2
(45) Date of Patent: *Aug. 30, 2022

(54) SEMICONDUCTOR DEVICE PERFORMING IMPLICIT PRECHARGE OPERATION

(71) Applicant: MICRON TECHNOLOGY, INC., Boise, ID (US)

(72) Inventor: Homare Sato, Sagamihara (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/235,761

(22) Filed: Apr. 20, 2021

(65) Prior Publication Data

US 2021/0241816 A1 Aug. 5, 2021

Related U.S. Application Data

(63) Continuation of application No. 16/576,621, filed on Sep. 19, 2019, now Pat. No. 10,991,415.

(51) Int. Cl.
*G11C 11/4076* (2006.01)
*H01L 25/065* (2006.01)
*G11C 11/408* (2006.01)

(52) U.S. Cl.
CPC ...... *G11C 11/4076* (2013.01); *H01L 25/0657* (2013.01); *G11C 11/4087* (2013.01); *H01L 2225/06541* (2013.01)

(58) Field of Classification Search
CPC ............ G11C 11/4076; G11C 11/4087; G11C 5/06; G11C 7/1072; G11C 7/222; G11C 5/04; G11C 7/12; G11C 2207/2272; G11C 11/4072; H01L 25/0657; H01L 2225/06541; H01L 24/05; H01L 24/06; H01L 24/16; H01L 24/17; H01L 2224/0401; H01L 2224/0557; H01L 2224/06181; H01L 2224/17181; H01L 2225/06513; H01L 2224/16145; H01L 2225/06517
USPC ....................................... 365/189.5
See application file for complete search history.

(56) References Cited

U.S. PATENT DOCUMENTS

| 4,245,167 | A | * | 1/1981 | Stein ...................... H03K 5/156 327/78 |
| 8,659,928 | B1 | | 2/2014 | Stephens, Jr. |
| 8,737,160 | B2 | * | 5/2014 | Hayashi ............. G11C 11/4076 365/194 |

(Continued)

FOREIGN PATENT DOCUMENTS

CN 111352492 A * 6/2020

*Primary Examiner* — Fernando Hidalgo
(74) *Attorney, Agent, or Firm* — Dorsey & Whitney LLP

(57) ABSTRACT

Disclosed herein is an apparatus that includes a first semiconductor chip having a latency counter supplied with a first command and configured to generate a second command when a predetermined period is elapsed after the first command is activated; and a second semiconductor chip having an active control circuit configured to activate a state signal in response to the first command when the state signal is in an inactive state, deactivate the state signal in response to the first command when the state signal is in an active state, and activate the state signal in response to the second command generated based on the first command that is activated when the state signal is in the active state.

20 Claims, 7 Drawing Sheets

(56) References Cited

U.S. PATENT DOCUMENTS

| | | | |
|---|---|---|---|
| 9,521,337 B1* | 12/2016 | Shen | ................... H04N 5/3745 |
| 10,991,415 B2 | 4/2021 | Sato | |
| 2018/0341575 A1 | 11/2018 | Narui et al. | |
| 2020/0303030 A1 | 9/2020 | Lee | |
| 2022/0115069 A1* | 4/2022 | Jung | ................. G11C 16/0483 |

* cited by examiner

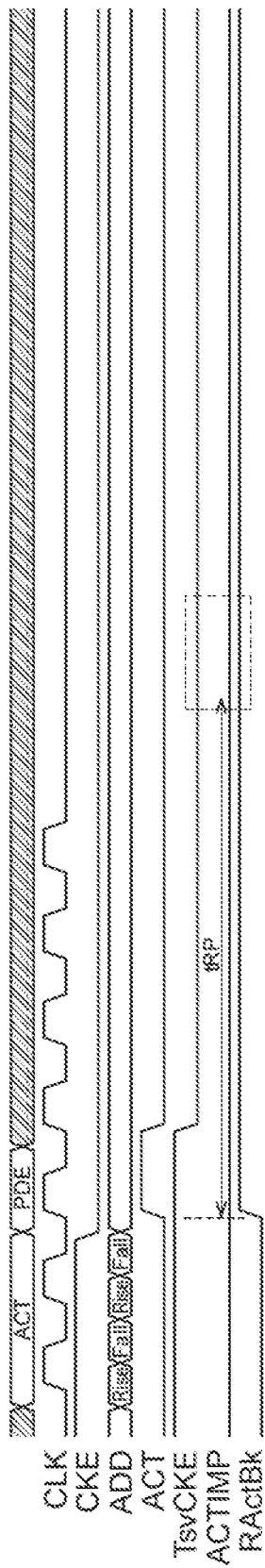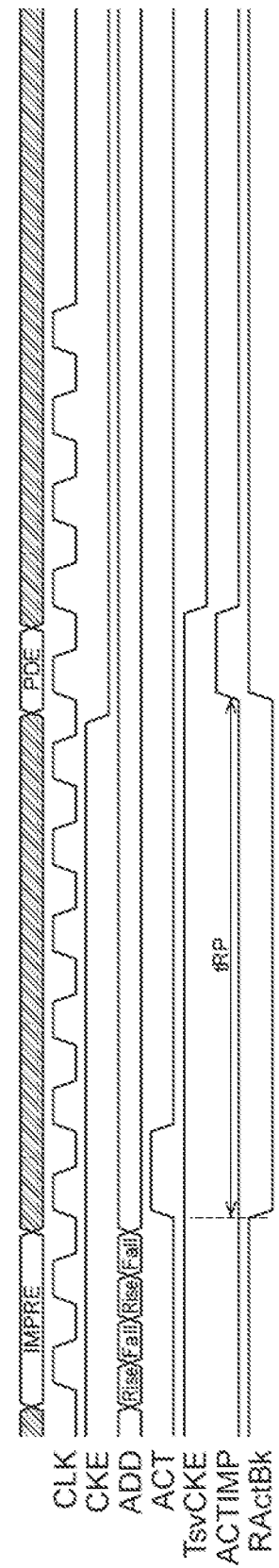

SEMICONDUCTOR DEVICE PERFORMING IMPLICIT PRECHARGE OPERATION

CROSS-REFERENCE TO RELATED APPLICATION (S)

This application is a continuation of U.S. patent application Ser. No. 16/576,621, filed Sep. 19, 2019, issued as U.S. Pat. No. 10,991,415 on Apr. 27, 2021. This application and patent are incorporated by reference herein in their entirety and for all purposes.

BACKGROUND

In a DRAM (Dynamic Random Access Memory), an operation called "Implicit Precharge" is sometimes performed. The implicit precharge is an operation of issuing an active command again to a memory bank that is in an active state to change the memory bank in the active state to an inactive state (a precharge state) and then generating an internal command after a predetermined period is elapsed, thereby changing the memory bank to the active state again. Accordingly, a latency counter for generating an internal command after the predetermined time is elapsed from issuance of an active command is required to realize the implicit precharge operation. When the implicit precharge is to be realized in a memory device including an interface chip and memory core chips, such as an HBM (High Bandwidth Memory), there is a problem that a clock signal for operating the latency counter needs to be supplied from the interface chip to the memory core chips and current consumption increases if the latency counter is placed on the memory core chips.

BRIEF DESCRIPTION OF THE DRAWINGS

FIG. 5 and FIG. 6A to 6D are waveform charts for explaining an operation of the active control circuit.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
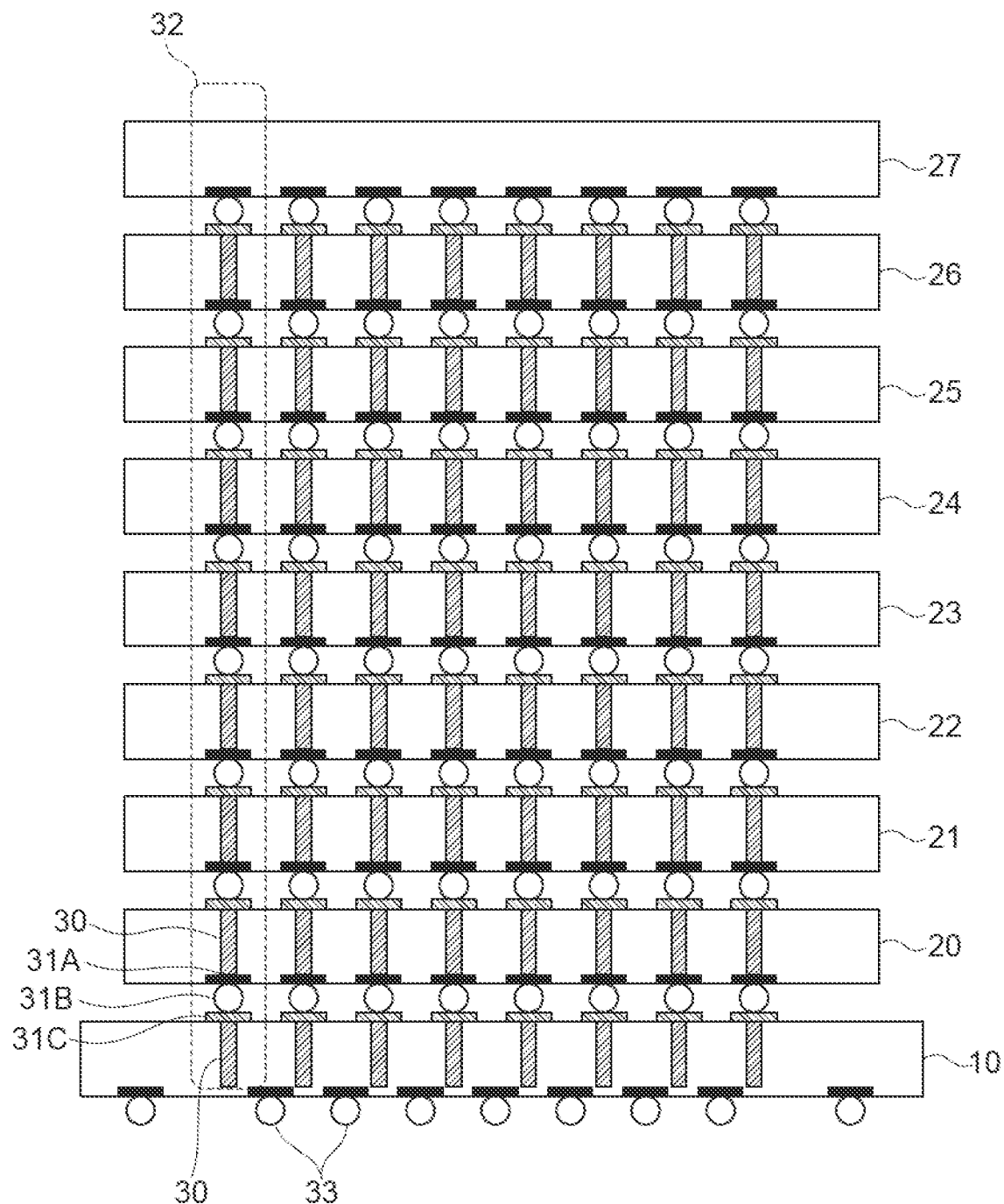
FIG. 1 is a schematic diagram showing a configuration of a semiconductor device according to the present disclosure.

A semiconductor device shown in FIG. 1 is an HBM having a structure in which eight memory core chips 20 to 27 are stacked one on top of another on an interface chip 10.

However, subject matters of the present invention are not limited to the HBM. The memory core chips 20 to 27 are semiconductor chips on each of which a memory core including a memory cell array is integrated. The interface chip 10 is a semiconductor chip that controls the memory core chips 20 to 27. Each of the interface chip 10 and the memory core chips 20 to 26 includes a plurality of TSVs 30 provided to penetrate through the corresponding semiconductor substrate. The interface chip 10 and the memory core chips 20 to 27 are all stacked by a face-down method, that is, in such a manner that principal surfaces on which transistors and wiring patterns (all not shown) are formed face downward. Accordingly, the memory core chip 27 located in the topmost layer does not need the TSVs 30. However, the memory core chip 27 located in the topmost layer may include the TSVs 30. Most of the TSVs 30 provided on the memory core chips 20 to 26 are connected to front TSV pads 31A located at same planar positions, respectively. In contrast thereto, most of the TSVs 30 provided on the interface chip 10 and the front TSV pads 31A provided on the interface chip 10 are located at different planar positions. The TSVs 30 located at the same planar positions among the TSVs 30 provided on the interface chip 10 and the memory core chips 20 to 26 are cascade connected via the front TSV pads 31A, TSV bumps 31B, and back TSV pads 31C, respectively, so that a plurality of signal paths 32 are formed. Commands and write data output from the interface chip 10 are supplied to the memory core chips 20 to 27 via the signal paths 32. Read data output from the memory core chips 20 to 27 are supplied to the interface dup 10 via the signal paths 32. External terminals 33 are provided on the interface chip 10 and transmission/reception of signals to/from an external circuit is performed via the external terminals 33.

Figure 2:
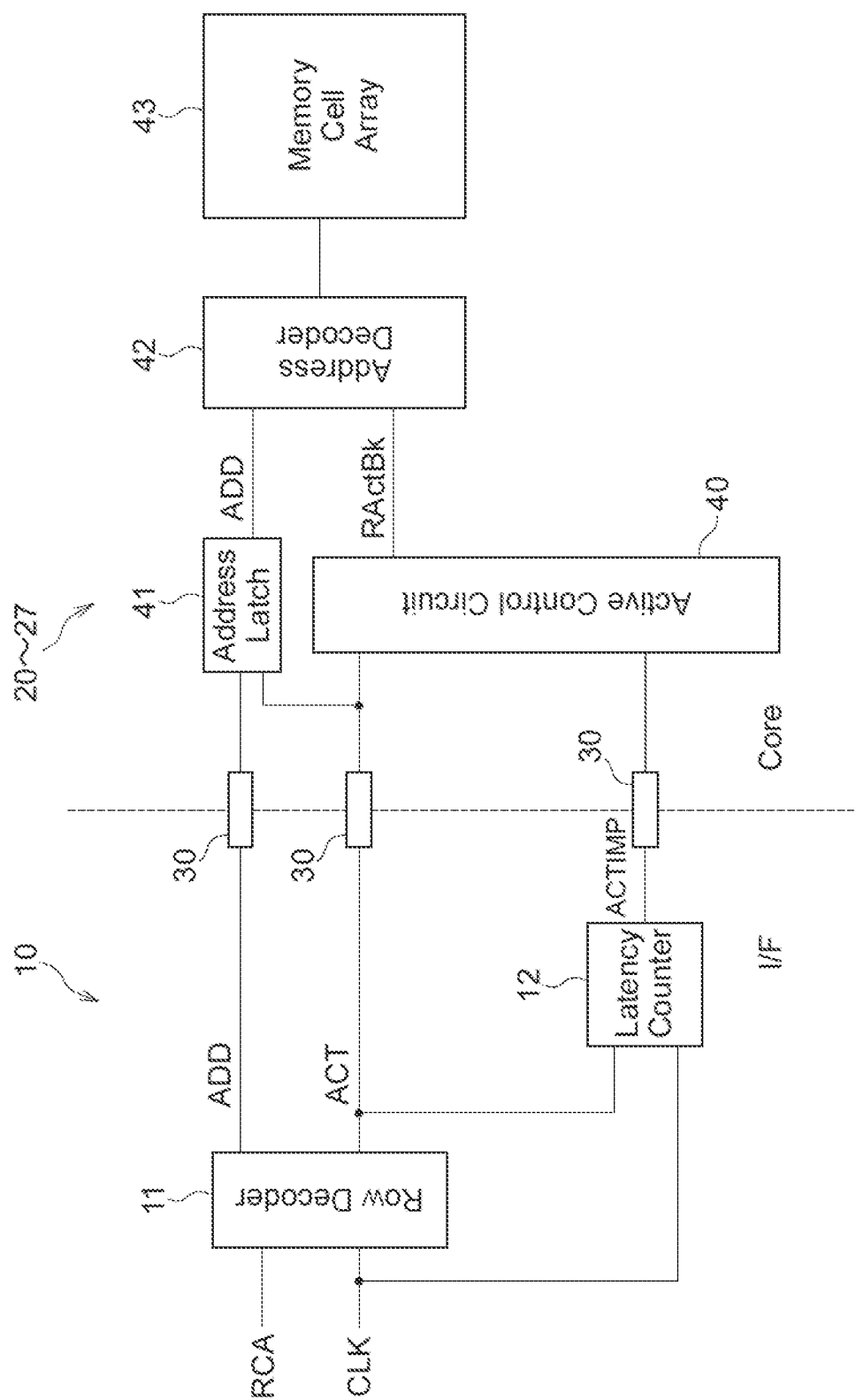
FIG. 2 is a block diagram showing a configuration of relevant parts of the semiconductor device according to the present disclosure.

As shown in FIG. 2, the interface chip 10 includes a row decoder 11 and a latency counter 12. The row decoder 11 receives a command address signal RCA and a clock signal CLK and generates an address signal ADD and an internal command. One type of the internal command is an active command ACT. The active command ACT is supplied to the memory core chips 20 to 27 via the TSVs 30 and is supplied also to the latency counter 12. The address signal ADD is also supplied to the memory core chips 20 to 27 via the TSVs 30. The address signal ADD may be divided and supplied to the memory core chips 20 to 27 in plural times. The latency counter 12 receives the active command ACT and the clock signal CLK. The latency counter 12 generates an internal command ACTIMP after a predetermined cycle of the clock signal CLK is elapsed from activation of the active command ACT. The internal command ACTIMP is supplied to the memory core chips 20 to 27 via different TSVs 30.

Each of the memory core chips 20 to 27 includes an active control circuit 40, an address latch circuit 41, an address decoder 42, and a memory cell array 43. The active control circuit 40 receives the active command ACT and the internal command ACTIMP and generates a state signal RActBk. The state signal RActBk is a signal indicating the state of the memory cell array 43 and is at a high level when the memory cell array 43 is in an active state while being at a low level when the memory cell array 43 is in an inactive state (a precharge state). The state signal RActBk is supplied to the address decoder 42 alone with the address signal ADD latched by the address latch circuit 41. The address decoder 42 decodes the address signal ADD and performs a row access to the memory cell array 43. The memory cell array 43 may be divided into a plurality of memory banks. In this case, the active control circuit 40 is allocated to each of the memory banks.

Figure 3:
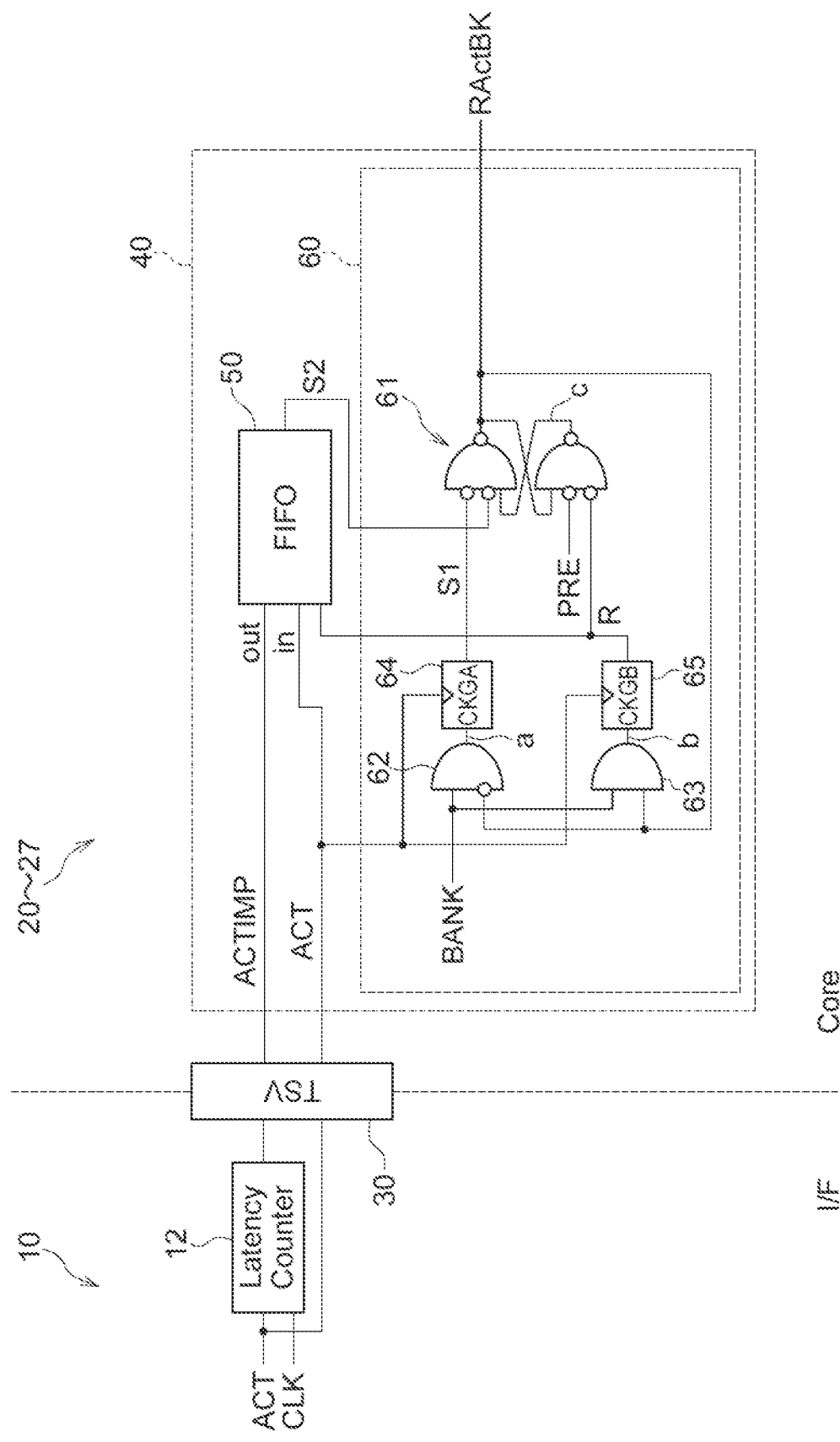
FIG. 3 is a circuit diagram of an active control circuit shown in FIG. 2.

As shown in FIG. 3, the active control circuit 40 includes a FIFO circuit 50 and a state circuit 60. The state circuit 60 includes an SR latch circuit 61, AND gate circuits 62 and 63, and clock gate circuits 64 and 65. The SR latch circuit 61 is set in response to a set signal S1 or S2 and is reset in response to a reset signal R or a precharge command PRE. The precharge command PRE is one type of the internal command generated by the row decoder 11. The state signal RActBk is activated to a high level when the SR latch circuit 61 is set, and the state signal RActBk is deactivated to a low level when the SR latch circuit 61 is reset. The AND gate circuits 62 and 63 receive a bank select signal BANK and the state signal RActBk and generate internal signals a and b, respectively. Because an inverted signal of the state signal RActBk is input to the AND gate circuit 62, the internal signal a is activated when the state signal RActBk is at a low level, that is, the memory cell array 43 is in the precharge state. On the other hand, the state signal RActBk is input as it is to the AND gate circuit 63. Therefore, the internal signal b is activated when the state signal RActBk is at a high level, that is, when the memory cell array 43 is in the active state. The internal signals a and b are supplied to the clock gate circuits 61 and 65, respectively. The clock gate circuits 64 and 65 allow the internal signals a and b to pass, respectively, during a period in which the active command ACT is activated. The internal signal a having passed through the clock gate circuit 64 is the set signal S1. The internal signal b having passed through the clock gate circuit 65 is the reset signal R. The reset signal R is supplied also to the FIFO circuit 50. The FIFO circuit 50 latches the reset signal R in response to the active command ACT and outputs the latched reset signal R in response to the internal command ACTIMP. The reset signal R output from the FIFO circuit 50 is used as the set signal S2.

Figure 4:
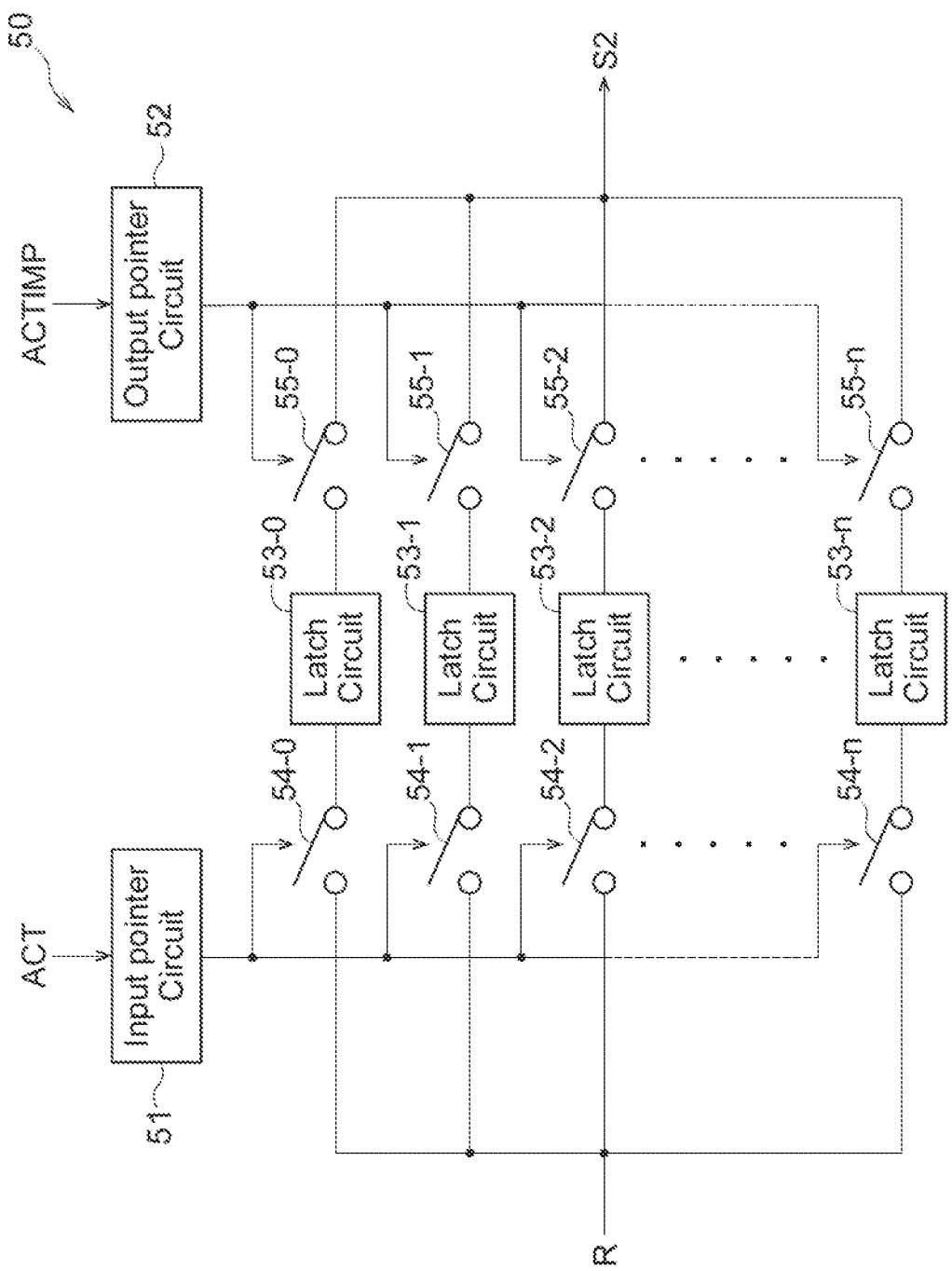
FIG. 4 is a circuit diagram of a FIFO circuit shown in FIG. 3.

As shown in FIG. 4, the FIFO circuit 50 is a point-shift FIFO circuit including an input pointer circuit 51 and an output pointer circuit 52. An input point value output from the input pointer circuit 51 is supplied to switch circuits 54-0 to 54-n. One of the switch circuits 54-0 to 54-n is brought into conduction according to the input point value. The input pointer circuit 51 updates the input point value each time the active command ACT is activated. An output point value output from the output pointer circuit 52 is supplied to switch circuits 55-0 to 55-n. One of the switch circuits 55-0 to 55-n is brought into conduction according to the output point value. The output pointer circuit 52 updates the output point value each time the internal command ACTIMP is activated. The FIFO circuit 50 includes latch circuits 53-0 to 53-n corresponding to the switch circuits 54-0 to 54-n and the switch circuits 55-0 to 55-n, respectively. Accordingly, the reset signal R input to the FIFO circuit 50 is latched by one of the latch circuits 53-0 to 53-n via a conducting one of the switch circuits 54-0 to 54-n. The reset signal R latched by one of the latch circuits 53-0 to 53-n is output as the set signal S2 via a conducting one of the switch circuits 55-0 to 55-n.

An operation of the active control circuit 40 is explained next. In an example shown in FIG. 5, an active command is externally issued with designation of a memory bank BAa at each of times t1 and t2, and active commands are externally issued with designation of memory banks BAb to BAd at times t3 to t5, respectively. When an active command is issued at the time t1, the memory bank BAa is in the precharge state. In contrast thereto, when an active command is issued at the time t2, the memory bank BAa is in the active state. Accordingly, when the active command is issued at the time t2, an implicit precharge operation is performed.

First, when an active command is issued at the time t1, the row decoder 11 shown in FIG. 2 activates the active command ACT. Because the state signal RActBk is at a low level at this point of time, the internal signal a is at a high level and the internal signal b is at a low level. When the active command ACT is activated in this state, the set signal S1 is activated. The reset signal R is not activated. Accordingly, the reset signal R at an inactive level is latched by a predetermined latch circuit in the FIFO circuit 50. When the set signal S1 is activated, the SR latch circuit 61 is set and the state signal RActBk changes to a high level. Therefore, the memory bank BAa transitions from the precharge state to the active state. Further, the internal signal a changes to a low level and the internal signal b changes to a high level. Practically, an active command externally issued is activated for a two-clock cycle as shown in FIG. 6A and the address signal ADD is divided and transferred in four times in synchronization with rising edges and falling edges of the clock signal CLK, respectively, during that period.

Next, when an active command is issued again at the time t2 with designation of the memory bank BAa, the row decoder 11 shown in FIG. 2 activates the active command ACT again. At this point of time, the state signal RActBk is at a high level, the internal signal a is at a low level, and the internal signal b is at a high level. When the active command ACT is activated in this state, the reset signal R is activated. Accordingly, the reset signal R at an active level is latched by a predetermined latch circuit in the FIFO circuit 50. The set signal S1 is not activated. When the reset signal R is activated, the SR latch circuit 61 is reset and the state signal RActBk changes to a low level. Accordingly, the memory bank BAa transitions from the active state to the precharge state. Further, the internal signal a changes to a high level and the internal signal b changes to a low level. In FIG. 6B, a second active command is denoted by IMPRE. Thereafter, when an active command is issued at the time to with designation of the memory bank BAb, the bank select signal BANK changes to a low level and accordingly the internal signal a also changes to a low level.

Figure 5:
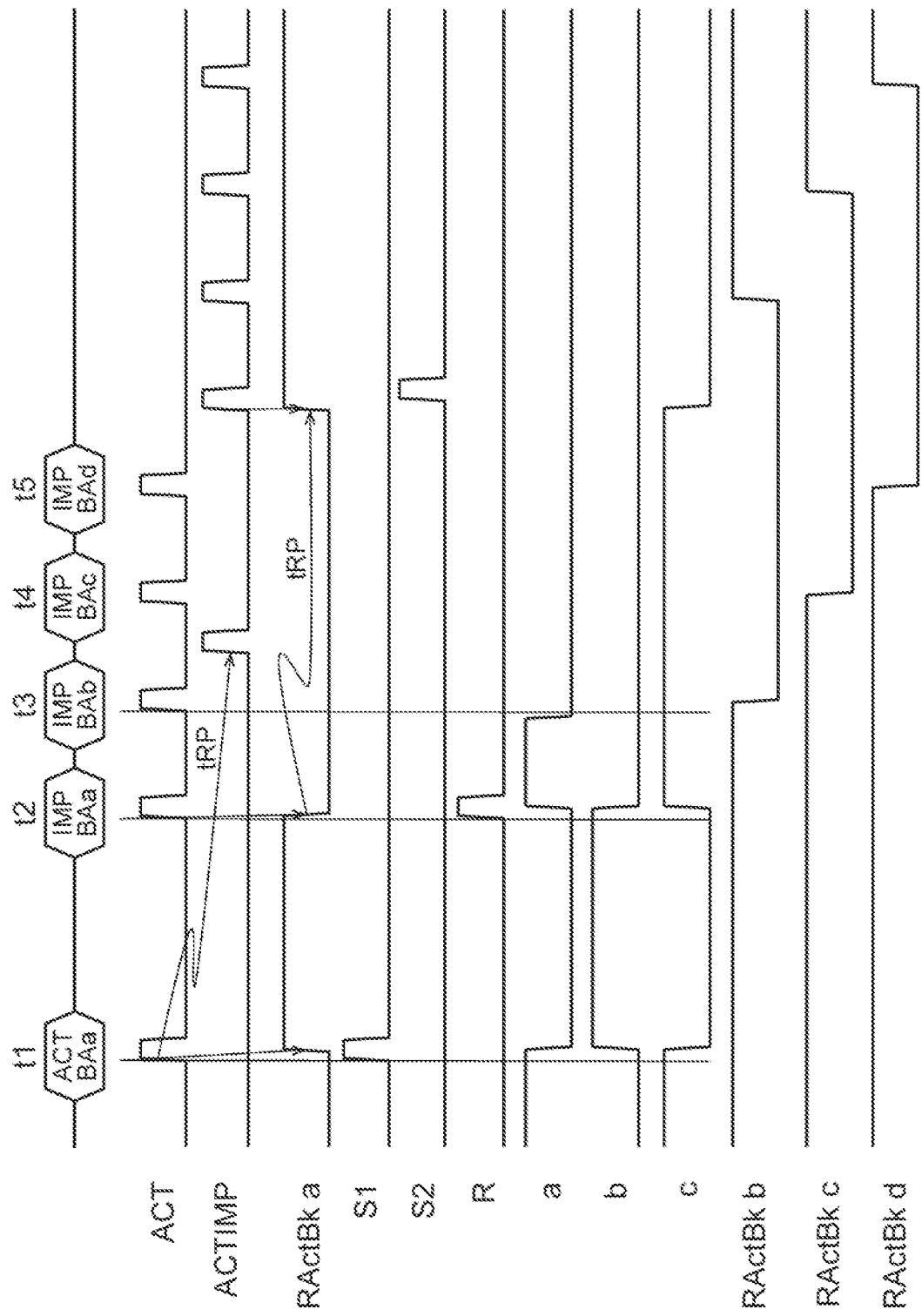
Figure 6A:
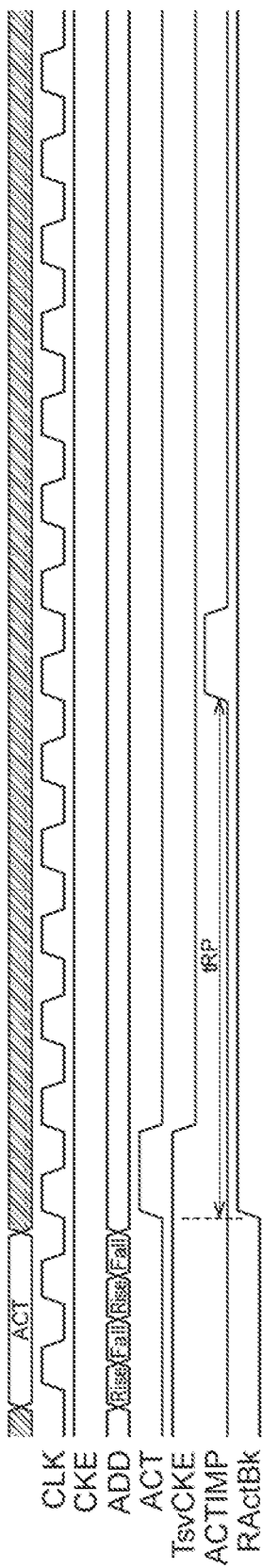
Figure 6B:
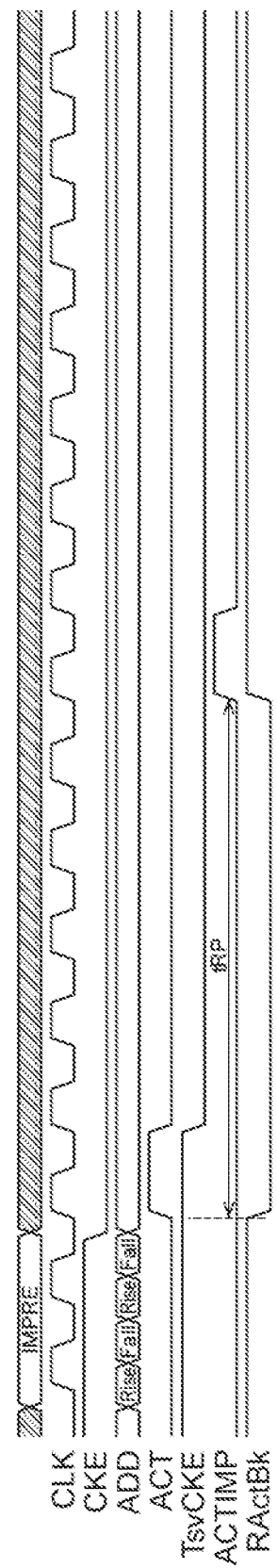

When a predetermined period tRP is elapsed from the time t1, the latency counter 12 shown in FIG. 2 activates the internal command ACTIMP (see FIGS. 5 and 6A). Accordingly, the reset signal R latched at the time t1 is output from the FIFO circuit 50 as the set signal S2. However, because the reset signal R latched at the time t1 is at an inactive level as described above, the set signal S2 is not activated. Meanwhile, when the predetermined period tRP is elapsed from the time t2, the latency counter 12 activates the internal command ACTIMP (see FIGS. 5 and 6B). Accordingly, the reset signal R latched at the time t2 is output from the FIFO circuit 50 as the set signal S2. Because the reset signal R latched at the time t2 is at an active level as described above, the set signal S2 is activated. When the set signal S2 is activated, the SR latch circuit 61 is set and the state signal RActBk changes to a high level. Therefore, the memory bank BAa transitions from the precharge state to the active state. In this way, when an active command is externally issued again to a memory bank in the active state, the implicit precharge operation is performed. The implicit precharge operation is performed also to the memory banks BAb to BAd in response to active commands issued at the times t3 to t5, respectively.

As described above, the semiconductor device according to the present disclosure has the latency counter 12 that generates the internal command ACTIMP, which is placed on the interface chip 10. Therefore, there is no need to supply a clock signal for operating a latency counter from an interface chip to memory core chips. Accordingly the current consumption can be reduced as compared to a case where the latency counter 12 is placed on the memory core chips 20 to 27. Furthermore, because the state circuit 60 that determines whether each of the memory banks is in the active state is provided on each of Are memory core chips 20 to 27, the state circuit 60 does not need to be placed on the interface chip 10.

If a power down command is issued immediately after an active command is externally issued as shown in FIG. 6C, the clock signal CLK is stopped, so that the count operation of the latency counter 12 stops and the internal command ACTIMP is not generated. In this case, the relation between the input point value and the output point value becomes incorrect. To prevent this situation, the latency counter 12 and the FIFO circuit 50 are reset to air initial state. Further, to enter a power down mode after an active command (IMPRE) for performing the implicit precharge operation is issued as shown in FIG. 6D, it suffices to issue a power down command after the internal command ACTIMP is generated.

Although this invention has been disclosed in the context of certain preferred embodiments and examples, it will be understood by those skilled in the art that the inventions extend beyond the specifically disclosed embodiments to other afternative embodiments and or uses of the inventions and obvious modifications and equivalents thereof. In addition, other modifications which are within the scope of this invention will Ire readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A method comprising:
   activating a first command at a first time, wherein during the first time a state signal is at a first level;
   activating, at a second time subsequent to the first time, the first command and a reset signal after the state signal is set at a second level;
   changing the state signal to the first level in response to the reset signal;
   activating a second command when a predetermined period is elapsed from the second time; and
   changing the state signal to the second level in response to the second command.

2. The method of claim 1, further comprising:
   latching the reset signal at the second time and providing the reset signal a set signal based on the reset signal; and
   changing the state signal to the second level based on the set signal after the predetermined period is elapsed from the second time.

3. The method of claim 1, wherein at the first time, a first internal signal is at the second level and a second internal signal is at the first level.

4. The method of claim 3, further comprising:
   activating a second set signal in response to the first command being activated at the first time and the first internal signal being at the second level and the second internal signal being at the first level; and
   setting the state signal at the second level in response to the second set signal being activated.

5. The method of claim 1, wherein at the second time, a first internal signal is at the first level and a second internal signal is at the second level.

6. The method of claim 1, further comprising:
   latching the reset signal at the first time, wherein the reset signal is inactivate at the first time;
   activating the second command when the predetermined time is elapsed from the first time; and
   producing a set signal based on the reset signal latched at the first time.

7. The method of claim 6, wherein the set signal is inactivated in response to the reset signal being inactive.

8. The method of claim 1, further comprising:
   issuing a power down command after the second command is activated in a power down mode.

9. An apparatus comprising:
   a first semiconductor chip having a latency counter supplied with a first command and a clock signal and configured to generate a second command when a predetermined period is elapsed after the first command is issued; and
   a second semiconductor chip having an active control circuit configured to activate a state signal in response to the second command generated based on the first command that is activated when the state signal is in an active state, wherein the second semiconductor chip is free of the clock signal.

10. The apparatus of claim 9, wherein the second semiconductor comprises a memory cell array.

11. The apparatus of claim 9, further comprising:
   TSVs penetrating through at least one of the first and second semiconductor chips.

12. The apparatus of claim 9, wherein the active control circuit comprises:
   a FIFO circuit configured to latch a reset signal in response to the first command and output the latched reset signal in response to the second command; and
   a state circuit configured to determine whether a memory bank is in an active state, the state circuit includes:
      an SR latch circuit configured to be set in response to a first set signal or a second set signal and be reset in response to the reset signal or a pre-charge command;
      a plurality of gate circuits configured to receive a bank select signal and the state signal and generate a first internal signal and a second internal signal; and
      a plurality of clock gate circuits configured to receive the first internal signal and the second internal signal, wherein the plurality of clock gate signals.

13. The apparatus of claim 12, wherein the plurality of clock signals comprises a first clock gate circuit and a second clock gate circuit, and wherein the first internal signal configured to pass through the first clock gate circuit is the second set signal and the second internal configured to pass through the second clock gate circuit is the reset signal.

14. The apparatus of claim 12, wherein the FIFO circuit further comprises:
   an input pointer circuit configured to update an input point value in response to the first command;

an output pointer circuit configured to update an output point value in response to the second command;
a first plurality of switch circuits configured to receive the input point value from the input pointer circuit;
a second plurality of switch circuits configured to receive the output point value from the output pointer circuit; and
a plurality of latch circuits coupled to the first plurality of switch circuits and the second plurality of switch circuits, respectively.

15. The apparatus of claim 13, wherein the plurality of latch circuits is configured to latch the reset signal via a conducting one of the first plurality of switch circuits and output the reset signal as a set signal via a conducting one of the second plurality of switch circuit.

16. The apparatus of claim 12, wherein the latency counter and the FIFO circuit are reset to an initial state when the clock signal is stopped.

17. The apparatus of claim 9, wherein the latency counter is configured to operate in synchronous with the clock signal.

18. An apparatus comprising:
a memory cell array; and
an active control circuit configured to receive an active command and an internal command and generate a state signal,
wherein the active control circuit is further configured to receive the active command at a first time when the state signal is at a first level and change the state signal to a second level,
wherein the active control circuit is further configured to receive the active command at a second time subsequent to the first time when the state signal is at the second level and activate a reset signal and change the state signal to the first level,
wherein the active control circuit is further configured to receive the internal command after a predetermined time period elapses from the first time and keep the state signal at the second level, and
wherein the active control circuit is further configured to receive the internal command after the predetermined time period elapse from the second time and change the state signal to the second level.

19. The apparatus of claim 18, wherein the state signal is at a first level when the memory cell array is in an active state and wherein the state signal is at a second level when the memory cell array is in a pre-charge state.

20. The apparatus of claim 18, wherein the memory cell array comprises a plurality of memory banks, and wherein the active control circuit is allocated to each memory bank of the plurality of memory banks.

* * * * *